United States Patent [19]

Shibata et al.

[11] Patent Number: 5,206,517
[45] Date of Patent: Apr. 27, 1993

[54] ELECTRON BEAM LITHOGRAPHIC METHOD

[75] Inventors: Yukinobu Shibata, Juou; Ikuo Takada, Hitachi; Akira Hirakawa, Katsuta; Tadao Konishi, Mito, all of Japan

[73] Assignees: Hitachi, Ltd., Tokyo; Hitachi Instrument Engineering Co., Ltd., Katsuta, both of Japan

[21] Appl. No.: 798,905

[22] Filed: Nov. 27, 1991

[30] Foreign Application Priority Data

Nov. 30, 1990 [JP] Japan .................... 2-329181

[51] Int. Cl.$^5$ ............................................. H01J 37/30
[52] U.S. Cl. .................................................. 250/492.2
[58] Field of Search ........................ 250/492.2, 492.22

[56] References Cited

U.S. PATENT DOCUMENTS

| 4,147,937 | 4/1979 | Buelow et al. ............. 250/492.22 |
| 4,420,691 | 12/1983 | Zasio ........................... 250/492.2 |
| 4,538,232 | 8/1985 | Koyama ..................... 250/492.22 |
| 4,878,177 | 10/1989 | Ikenaga et al. ............. 250/492.22 |

Primary Examiner—Jack I. Berman
Assistant Examiner—Kiet T. Nguyen
Attorney, Agent, or Firm—Antonelli, Terry, Stout & Kraus

[57] ABSTRACT

An electron beam lithographic method in which a sample is irradiated with an electron beam, wherein an extreme point of a contour of a pattern is calculated and a lithographic area is divided into a first region that is surrounded by straight lines drawn from the extreme point in parallel with the x-axis and the y-axis of the sample and by said pattern, and second regions in order to be lithographed.

6 Claims, 5 Drawing Sheets

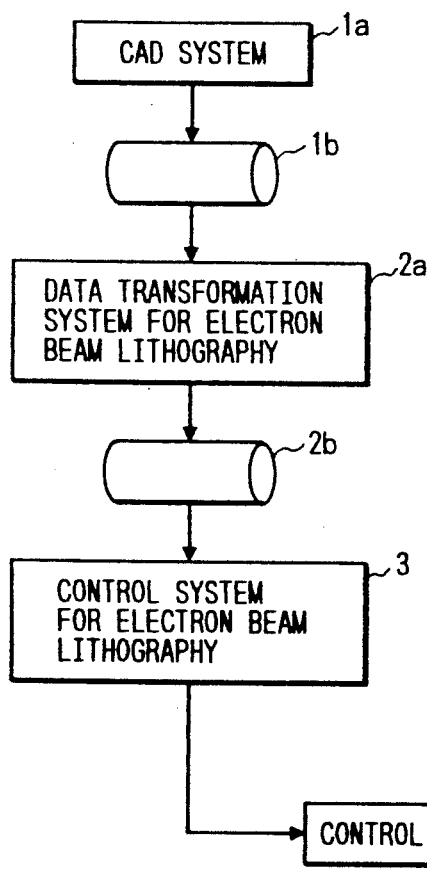
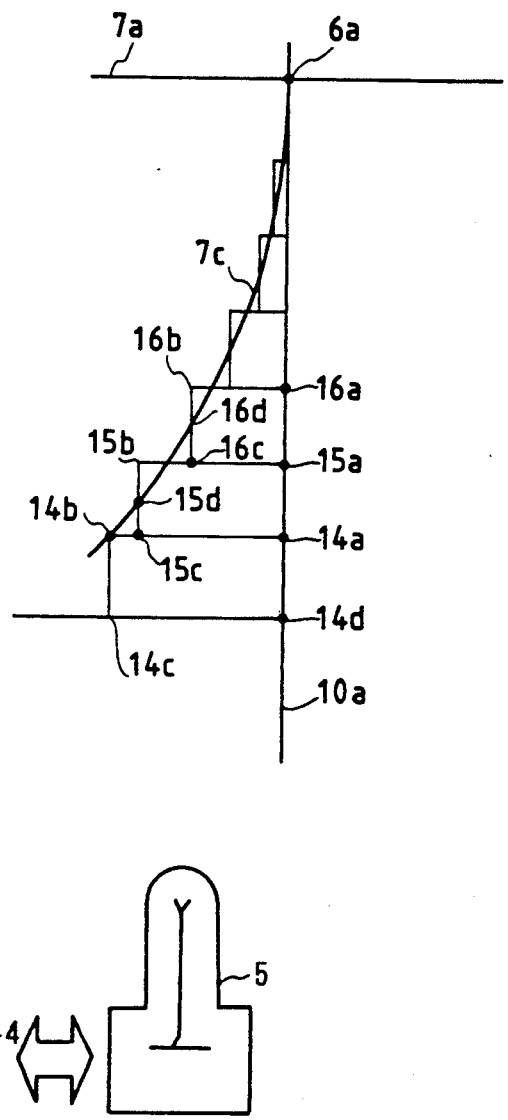

ized lithography is suppressed as much
ELECTRON BEAM LITHOGRAPHIC METHOD

BACKGROUND OF THE INVENTION

The present invention relates to an electron beam lithographic method which forms electronic circuitry (a pattern) on a semiconductor wafer using an electron beam.

A conventional lithography by an electron beam consists, in general, of sectionalizing a pattern to be lithographed and lithographing the sectionalized patterns successively.

So far, however, attention has not been given to a sufficient degree to minimize the number of sections of the pattern. In particular, when a side of the pattern before sectionalizing for lithography consists of a quadratic curve or a like curve such as a circle or an arc, it is necessary to approximately express the curve by a set of rectangular beams to lithograph it. In this case, however, the energy distribution of the electron beam loses stability unless the sectionalizing is suppressed as much as possible, and the precision of lithography is deteriorated.

The problem in this regard will be described in further detail in conjunction with the drawings.

FIG. 3 shows a pattern to be lithographed, and the data relating to the pattern are given as input data. The input data in this stage are called basic data, and the pattern thereof is called a basic pattern. FIG. 4 shows a lithographic pattern sectionalized by a conventional lithographic method when a closed pattern (formed of three line segments 7a, 7b and 7c) having at least one side of a curve 7c (arc in FIG. 3) is lithographed while effecting the black-white reversal processing necessary for the electron beam processing. As will be understood from FIG. 4, a curve must be expressed in steps by a set of quadrilaterals. By such a lithographic method, however, a large rectangle 8b is formed near a point 6b on the left side of FIG. 4, where the inclination of the curve 7c is loose. But narrow rectangles 8a are formed in a large number as the inclination of the curve 7c becomes steep, for example, near a point 6a at which the inclination of the curve 7c is a greatest value. However, when such narrow rectangles 8a are lithographed, the dimensional precision of pattern is adversely affected with respect to the amount of irradiation (amount of accumulated energy) of the electron beam. Furthermore, in the lithographic pattern reversed in black-white, particularly, in the case where the curve 7c is separated away from a border line 9b, narrow rectangles 8a are formed in great numbers. The precision decreases with an increase in the distance of separation.

One such conventional lithographic method is disclosed in Japanese Patent Laid-Open No. 154729/1987. Moreover, examples of sectionalizing of lithographic data are disclosed in U.S. Pat. No. 4,132,898 and Japanese Patent Laid-Open No. 251718/1989 which, however, do not imply any method of lithography with a precision high enough to overcome the aforementioned problem.

SUMMARY OF THE INVENTION

The object of the present invention therefore is to provide an electron beam lithographic method which is capable of decreasing the number of sectionalized parts of the lithographic areas in order to suppress the drop of precision of lithography and an apparatus therefor.

According to the present invention, an extreme point of the pattern is found, and the lithographic area is divided into a first region surrounded by straight lines drawn from the extreme point in parallel with the x-axis and the y-axis and by the pattern, and the other parts, second regions.

According to another aspect of the present invention, the substantially largest rectangular section is obtained from the first region, and this step is repeated for the remainder of the first region until a predetermined largest rectangular region (which, in general, is determined depending substantially upon the largest beam size) is no more substantially formed.

With the lithographic area divided as mentioned above, the second region can be subjected to solid exposure with the beam of the largest size contributing to decreasing the sections of the lithographic area in number corresponding and to suppressing the drop of precision of lithography.

Here, the "extreme point" refers to a position that indicates a maximal value and/or a minimal value, and further includes a position that indicates the greatest value and/or the smallest value.

Moreover, the first region is so sectionalized as to obtain the largest rectangular section thereby to prevent the forming of narrow rectangles having small widths. When the narrow rectangles are lithographed, the dimensional precision of the lithographed pattern lowers due to the amount of irradiation (amount of accumulated energy) of the electron beam. According to the present invention which prevents the narrow rectangles with small widths from being formed, however, the dimensional precision is not deteriorated.

BRIEF DESCRIPTION OF THE DRAWINGS

FIG. 2 shows the system construction of an apparatus which operates in the lithographic method of the present invention;

FIG. 5 is a diagram illustrating on an enlarged scale a portion of a lithographic pattern of the lithographic method of the present invention;

DETAILED DESCRIPTION OF THE PREFERRED EMBODIMENTS

Figure 1:
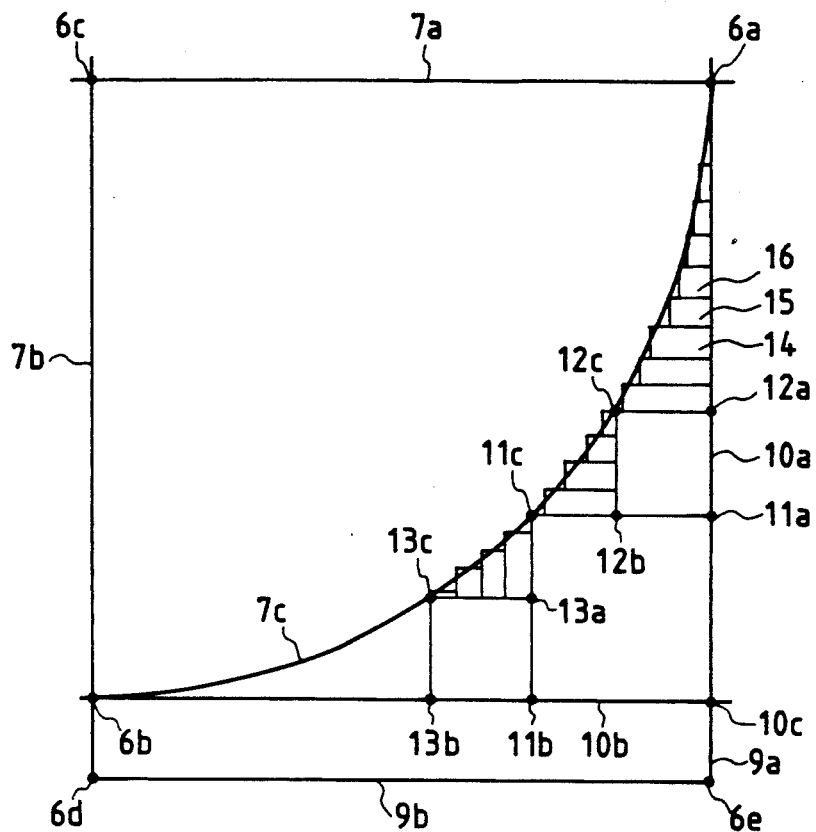
FIG. 1 is a diagram for illustrating a lithographic method of an embodiment of the present invention.

FIG. 2 illustrates the whole configuration of an electron beam lithographic system to which the present invention is adapted, and wherein reference numeral 1a denotes a CAD system for designing a circuit pattern of a semiconductor device. A CAD data file 1b prepared by this system is handed as an input data file over to a data transformation system 2a by electron beam (hereinafter referred to as EB) lithography. Here, the CAD data are transformed into data of a form that can be read by an apparatus that meets the EB apparatus. The result is output to an EB lithographic pattern data file 2b. The data file 2b is input as an input data file into a control system 3 for electron beam lithography, and is further input via a control device 4 to an electron beam lithographic apparatus 5 to carry out the lithography.

Figure 3:
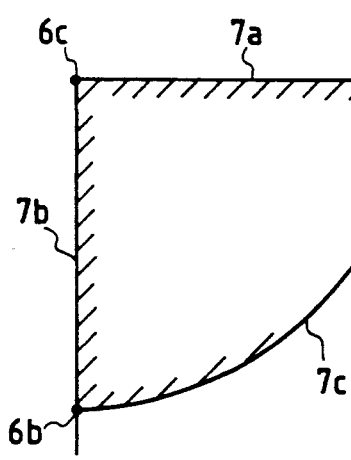
FIG. 3 shows a pattern to be lithographed.
Figure 6A:
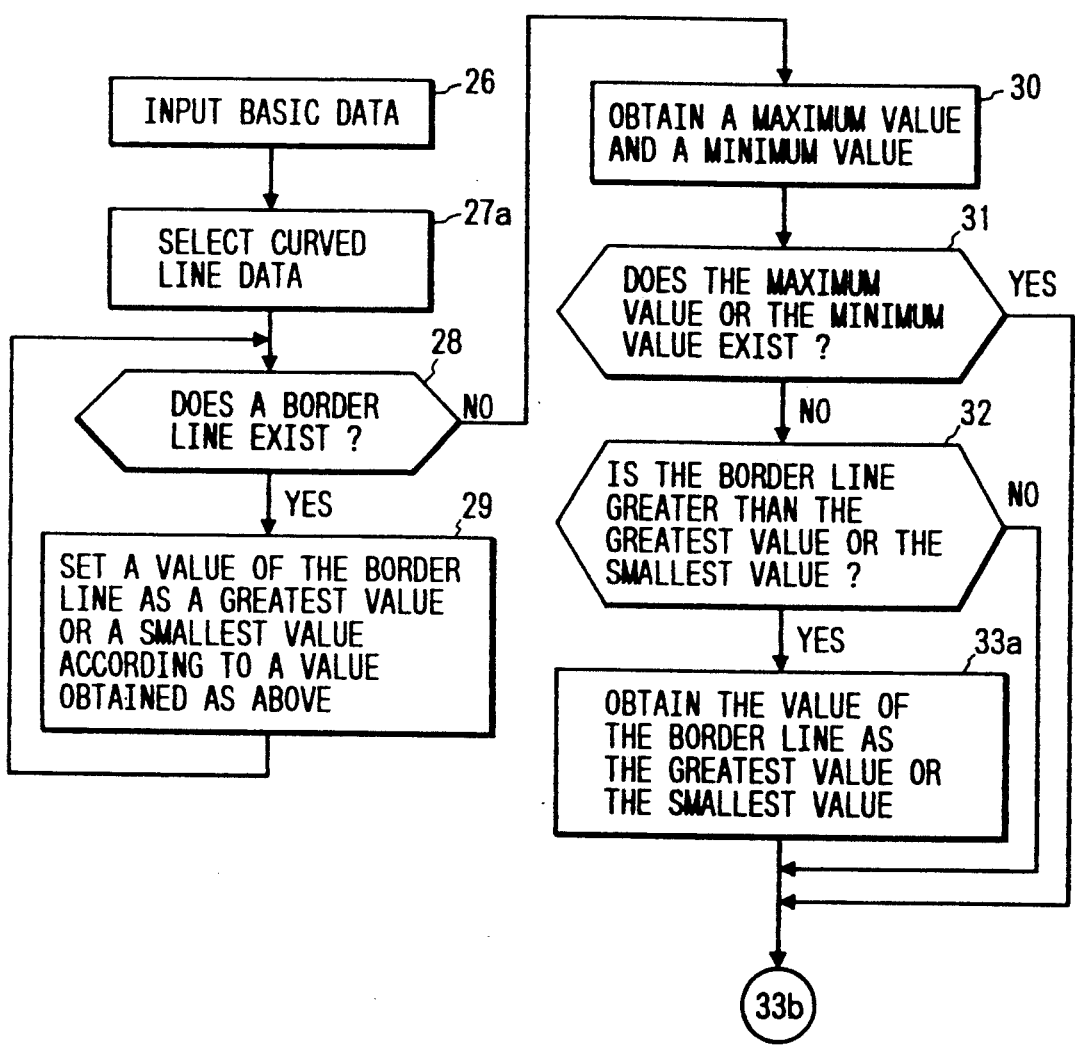
FIGS. 6A and 6B are a flowchart of an algorithm for putting the lithographic method of the present invention into practice.
Figure 6B:
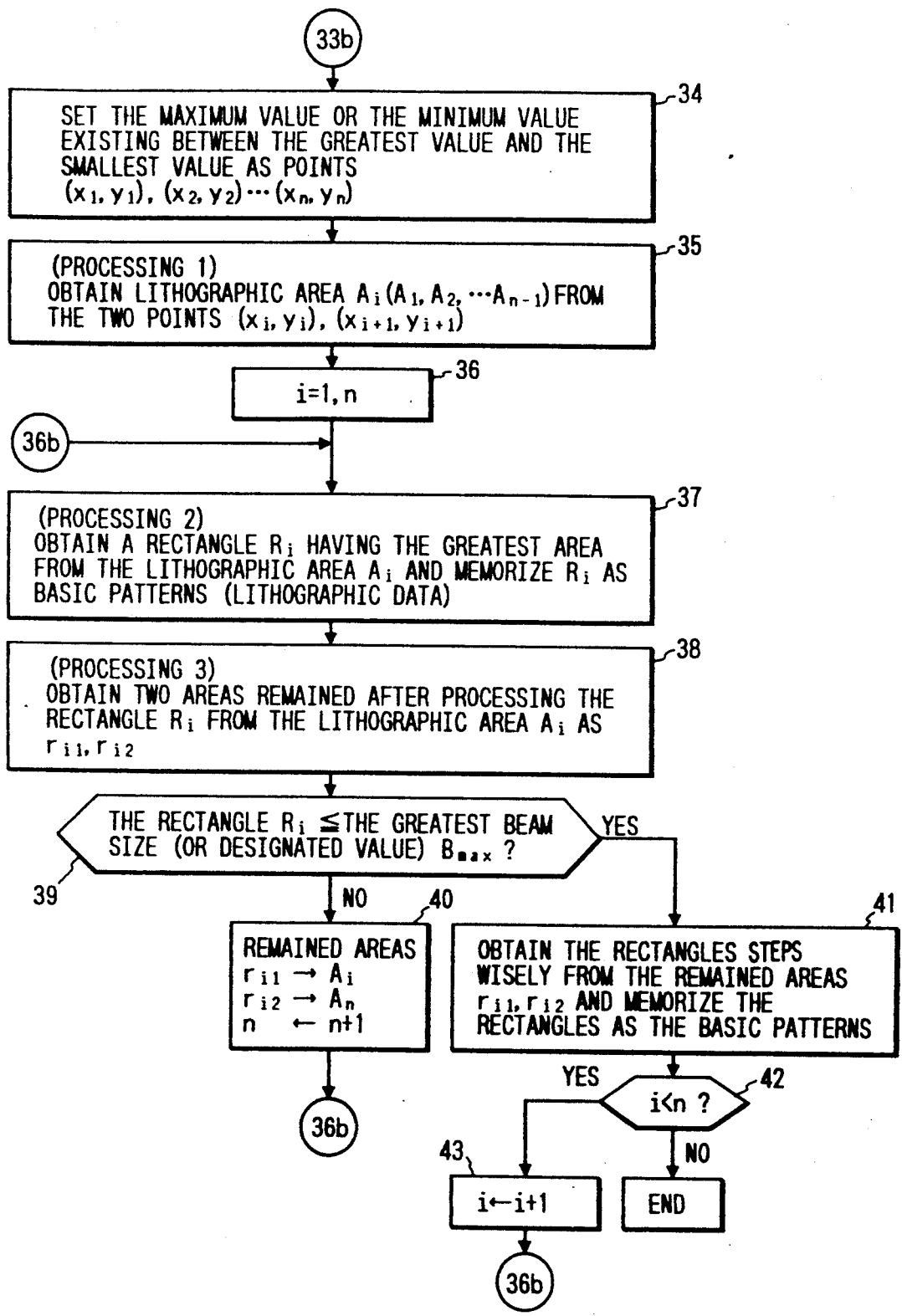

Referring to FIG. 3, for instance, assume that a figure constituted by three line segments 7a, 7b and 7c is an example of input data. The input data as a whole is called basic data. of input data. The input data as a whole is called basic data. data. Referring to FIG. 6(A), "input basic data" 26 means "reading of the input data, and curved line data (e.g., the one denoted by 7c in FIG. 3) is selected from the input data in step 27a. Then, it is checked whether there exist border lines 9a, 9b (which are lithographable areas provided by the deflection function of an electro-optical system, and are called, for example, field-subfield borders) with respect to the curve 7c (process of step 28 in FIG. 6(A)). In this case, the border lines, if they exist, are stored as the greatest values or as the smallest values according to the condition of existence (process of step 29). Then, a maximal value and a minimal value of the curve 7c are found (process of step 30). When either one of the maximal value and the minimal value exists, or when there exists none of them (discrimination at a step 31), the greatest value and the smallest value of the curve 7c are determined and are compared in magnitude with the border lines (process at a step 32). When the value (greatest value) of the border line is greater than the value of 7c, the value of the border line is taken in as the greatest value. The smallest value is determined in the same manner as described above (process of step 33a). If there exists a group of points (one or more maximal or minimal values) between the smallest value and the greatest value thus obtained, a relationship of their magnitudes is found (sorting process of step 34). The group of points is set as $(x_1, y_1; x_2, y_2; ---; x_n, y_n)$.

Figure 4:
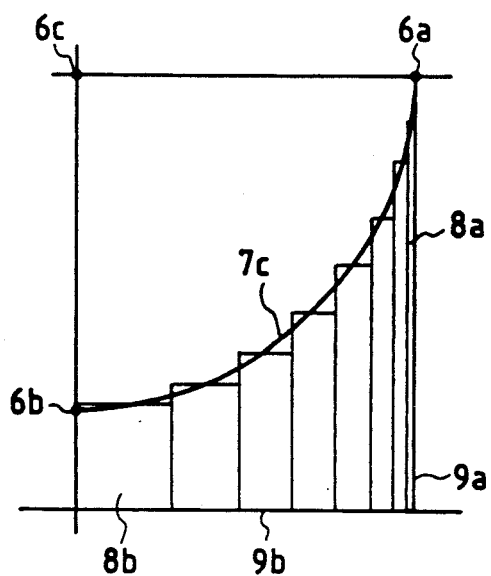
FIG. 4 illustrates a conventional lithographic method.

Then, approximation of the rectangular sectionalizing is performed in order to draw the curve. Here, to accomplish better approximation, the above results $(x_1, y_1), (x_2, y_2), ---, (x_n, y_n)$ are set as points, and a solid lithography area (solid lithographing is equal to solid exposure) is determined. The solid lithographing area means an area to which solid exposure is carried out by the electron beam of a predetermined maximum size. In FIG. 1, the solid lithographing area is the one that is surrounded lines passing the points 6b, 6d, 6e and 10c. The solid area is registered as a basic pattern (lithographing data). Finely sectionalized patterns are prone to form in an area 6a, 6b, 10c excepting the solid lithographing area 6b, 6d, 6e, 10c. As described above, the precision of lithography can be prevented from lowering by enabling individual patterns sectionalized in the above area to take shapes as near as possible to squares. According to the present invention, therefore, a rectangle 10c, 11a, 11c, 11b having the greatest area is determined as a basic pattern. Attention is given to two areas 6a, 11a, 11c and 6b, 11b, 11c that are separated by the basic pattern 10c, 11a, 11c, 11b. Then, the rectangles 11a, 12a, 12c, 12b and 13a, 13c, 13b, 11b having the greatest areas are determined as basic patterns in the same manner as described above. It is obviously meaningless to further obtain rectangles having the greatest areas from the remaining pattern such as the area 12a, 12c, 6a. Therefore, patterns such as oblong rectangles 14, 15, 16 are obtained along the arcuate line. The above sectionalizing is carried out for all of the areas. This processing does not create narrow frame-like patterns that are shown in FIG. 4.

Figure 7:
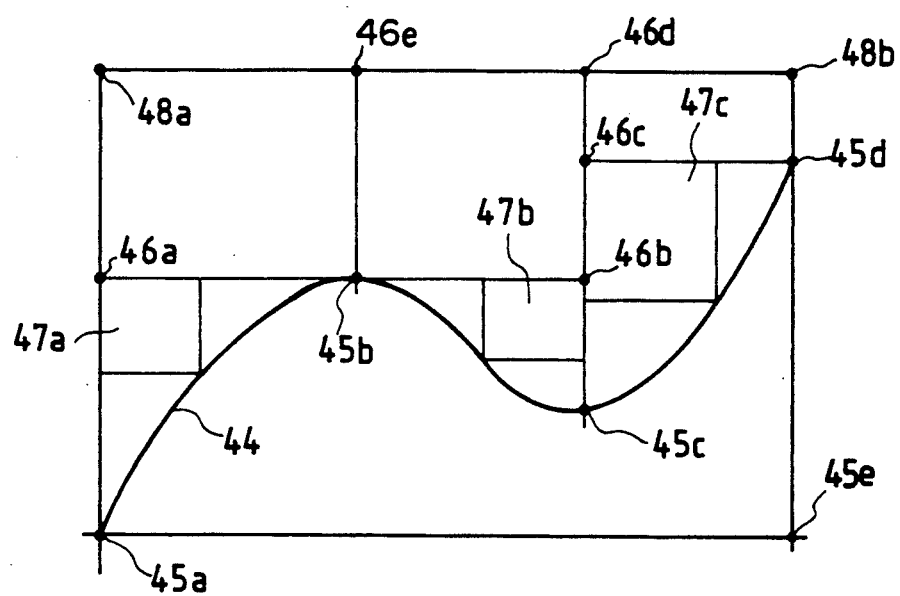
FIG. 7 is a diagram illustrating another embodiment of a lithographic method of the present invention.

A closed pattern of FIG. 7 surrounded by 45a, 45e, 45d has a maximal value 45b and a minimal value 45c.

Therefore, a pattern called solid lithographing area is found with two continuous points as a reference, in a manner that a portion $A_1$ surrounded by 48a, 46a, 46b, 46d is determined and then a portion $A_2$ surrounded by points 46d, 46c, 45d, 48b is determined. A solid lithographing area formed by all of these points is found (process of step 35). The above process is referred to as "processing 1".

A rectangle having the greatest area in the region is found for all of the solid lithographing areas that are found, and the found rectangle is denoted by Ri (process of step 37). If shown using FIG. 4, Ri represents a rectangle that is surrounded by 10c, 11a, 11c, 11b.

This rectangle Ri is registered as a basic pattern (lithographic data) too (process of step 37). This process is referred to as "processing 2". There remain two regions after the rectangle Ri is cut out from the region Ai. These regions are referred to as remained regions and are denoted by $r_{i1}$, $r_{i2}$ (process of step 38) (referred to as processing 3).

When the rectangle Ri is greater than the greatest beam size or the user-set value Bmax (process of step 39), the remained region $r_{i1}$ is substituted for Ai. The remained region $r_{i2}$ is put to the tail of the group of lithographic areas and is left to wait for the next processing. Moreover, 1 is added to the number n of the area groups (process of step 40).

When the rectangle Ri is smaller than Bmax, on the other hand, rectangles are approximated for the remained regions $r_{i1}$ and $r_{i2}$ so as to be best adapted to their curves. Then, the rectangles are obtained and are registered as basic patterns (process of step 41).

The process is completed when i becomes equal to or greater than n. In other cases, the process is continued until Ai becomes equal to An.

According to the present invention, the number of sections of the lithographic area decreases and the precision of lithography increases.

We claim:

1. An electron beam lithographic method in which a sample is irradiated with an electron beam and is lithographed by deflecting and turning on/off the electron beam, comprising the steps of:

obtaining an extreme point of a curve of a lithographic pattern;

dividing a lithographic area adjacent the curve into a first region completely surrounded by straight lines parallel to an x-axis and a y-axis of said lithographic pattern, the extreme point being on at least one of the straight lines, and second regions not including said first region.

2. An electron beam lithographic method according to claim 1, wherein said first region is substantially a largest rectangular region that can be obtained from said lithographic area, and wherein the dividing step is repeated for each of the second regions until a rectangular region of a predetermined minimum size can no longer be obtained.

3. An electron beam lithographic method according to claim 2, wherein said curve is interpolated by a straight line approximation.

4. An electron beam lithographic apparatus in which a sample is irradiated with an electron beam and is lithographed by deflecting and turning on/off the electron beam, comprising:

means for obtaining an extreme point of a curve of a lithographic pattern; and means for dividing a lithographic area adjacent the curve into a first region completely surrounded by straight lines parallel to an x-axis and a y-axis of said lithographic pattern, the extreme point being on at least one of the straight lines, and second regions not including said first region.

5. An electron beam lithographic apparatus according to claim 4, wherein said first region is substantially a largest rectangular region that can be obtained from said lithographic area, and wherein said dividing means subsequently divides each of said second regions until a rectangular region of a predetermined minimum size can no longer be obtained.

6. An electron beam lithographic apparatus according to claim 5, wherein said curve is interpolated by a straight line approximation.

* * * * *